United States Patent
Chen et al.

(10) Patent No.: US 6,878,232 B2
(45) Date of Patent: Apr. 12, 2005

(54) METHOD AND APPARATUS FOR IMPROVING A TEMPERATURE CONTROLLED SOLUTION DELIVERY PROCESS

(75) Inventors: Peir-Horng Chen, Taoyuan (TW); Yi-Ping Chen, Sanchung (TW); Hong-San Lan, Nantou (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 1 day.

(21) Appl. No.: 10/322,303

(22) Filed: Dec. 17, 2002

(65) Prior Publication Data

US 2004/0115949 A1 Jun. 17, 2004

(51) Int. Cl.[7] .......................... C23F 1/00; H01L 21/306
(52) U.S. Cl. ............................ 156/345.18; 156/345.15; 156/345.21; 118/666; 118/688
(58) Field of Search ....................... 156/345.15, 345.18, 156/345.21; 118/666, 688, 715, 728

(56) References Cited

U.S. PATENT DOCUMENTS

| | | | | |
|---|---|---|---|---|
| 5,500,081 A | * | 3/1996 | Bergman | 438/706 |
| 5,791,970 A | * | 8/1998 | Yueh | 451/8 |
| 6,200,414 B1 | * | 3/2001 | Hwang et al. | 156/345.18 |
| 6,207,068 B1 | * | 3/2001 | Glick et al. | 216/93 |

* cited by examiner

Primary Examiner—Jeffrie R. Lund
(74) Attorney, Agent, or Firm—Tung & Associates

(57) ABSTRACT

A method and apparatus for improving an operating efficiency for a process including temperature dependent fluid delivery including determining a projected time period to start a process during a non-operating time period; delivering a process fluid for performing the process along at least one fluid recirculation pathway for at least one selected time period the at least one fluid recirculation pathway including a substantial portion of a fluid delivery pathway for providing the process fluid to the process at a predetermined process temperature; and, providing the process fluid following the at least one selected time period to the process at the predetermined process temperature.

14 Claims, 1 Drawing Sheet

METHOD AND APPARATUS FOR IMPROVING A TEMPERATURE CONTROLLED SOLUTION DELIVERY PROCESS

FIELD OF THE INVENTION

This invention generally relates to semiconductor manufacturing processes and more particularly to a method and apparatus for improving the processing efficiency of a temperature controlled solution delivery system and semiconductor wafer treatment process, for example, a single wafer etching process.

BACKGROUND OF THE INVENTION

In the field of semiconductor wafer processing it is common practice to subject the semiconductor wafer to etching processes to remove a portion of a multi-layer device. The etching process is frequently quite sensitive to slight variations in temperature of the etching solution. Various types of wet etching processes and wet etching apparatus are used in the semiconductor wafer processing art to fabricate microelectronic integrated circuits. In the semiconductor wafer processing art devices are formed by depositing and etching integrated circuit components in multiple layers. Both wet and dry etching processes are used where a portion of a material layer is removed as part of the process to fabricate a feature or component of a semiconductor device. In both wet and dry processes, it is critical to remove material uniformly across the semiconductor wafer surface to maintain critical dimensions (CD) of the patterned structures and to avoid compromising subsequent processes such as photolithographic patterning processes. For example, where an etching process preferentially etches a portion of the wafer surface, semiconductor device structures are formed with CD's unacceptably outside of design specifications leading to costly rejection of the process wafer for subsequent processing.

For example, one type of wet etching process is spin wet etching where a single process wafer is mounted on a rotatable platen and rotated at high angular velocity while being contacted with a wet etching solution, for example by spraying the wet etching solution onto the wafer process surface. For example, following a dry etching process according to an overlying photolithographically patterned photoresist layer and following an ashing process to remove a portion of the photoresist layer, remaining ashing resistant photoresist polymeric residues are removed by a single wafer wet spin etching process. Several semiconductor wafer manufacturing processes likewise advantageously use a single wafer wet spin etching process to remove a portion of a material layer as the process may offer better control in terms of etching rates and etching uniformity.

In many single wafer wet spin etching processes, the temperature of the etching solution is critical since relatively small changes in the wet etching solution temperature may have a large impact on etching rates and fluid viscosities which are critical in a spin process. Since a single wafer wet spin etching process is typically optimized at a predetermined wafer spin rate and etching solution temperature where the etching process is carried out for predetermined time periods, changes in the etching solution temperature outside of process design constraints may lead to non-uniform etching including overetching or underetching of the process surface.

In a single wafer wet spin etching process according to the prior art, following a period of idleness or non-use it is necessary to operate the etcher for a period of time to bring the etching solution up to an operating delivery temperature. For example single wafer wet spin etchers of the prior art typically include an etching solution holding tank, a fluid pump and a heat exchanger in the etching solution flow pathway prior to delivery to the wet etching solution dispenser. Following a period of idleness, according to prior art processes, the single wafer wet spin etcher is operated for a warmup time period, for example by including a dummy wafer in the etcher, in order to bring the etching solution up to an appropriate operating temperature.

Frequently process tools included in a semiconductor manufacturing line, for example, including temperature dependent solution delivery systems for operating the tool, for example, single wafer wet spin etchers, have intervening periods of idleness or non-productive time. Following periods during which upstream manufacturing processes are either delayed or slowed, the solution delivery system is frequently put into a state of idleness to lower production costs. As a result, following the period of idleness, a warmup time period to bring the tool including a solution delivery system up to operating temperature further adds to non-productive time and thereby impairs the tools productive operating efficiency. Frequently, the required warmup time period is ill-defined since periods of idleness are unpredictable. In addition, it is prohibitively costly in terms of energy use and machine wear if the tools are continuously operated to preserve an operating temperature. As a result, temperature dependent fluid delivery system tools frequently have poor operating efficiencies, including delaying downstream production processes.

Thus, there is a need in the semiconductor device manufacturing art for a method and apparatus for improving the operating efficiency of temperature dependent process tools including solution delivery systems to reduce a startup processing time to increase tool operating efficiencies.

It is therefore an object of the invention to provide a method and apparatus for improving the operating efficiency of temperature dependent process tools including solution delivery systems to reduce a startup processing time to increase tool operating efficiencies while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method and apparatus for accomplishing the method for improving an operating efficiency for a process including temperature dependent fluid delivery.

In a first embodiment, the process includes determining a projected time period to start a process during a non-operating time period; delivering a process fluid for performing the process along at least one fluid recirculation pathway for at least one selected time period the at least one fluid recirculation pathway including a substantial portion of a fluid delivery pathway for providing the process fluid to the process at a predetermined process temperature; and, providing the process fluid following the at least one selected time period to the process at the predetermined process temperature.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method and recirculating solution delivery system of the present invention is explained with reference to single wafer wet etching processes it will be appreciated that the method and apparatus of the present invention may be adapted to other temperature dependent tools and processes including processes where a recirculating solution delivery system including a substantial portion of the operating fluid delivery flow pathway is selectively used to reduce a warmup or startup time to improve an operating efficiency of the wet process.

Figure 1:
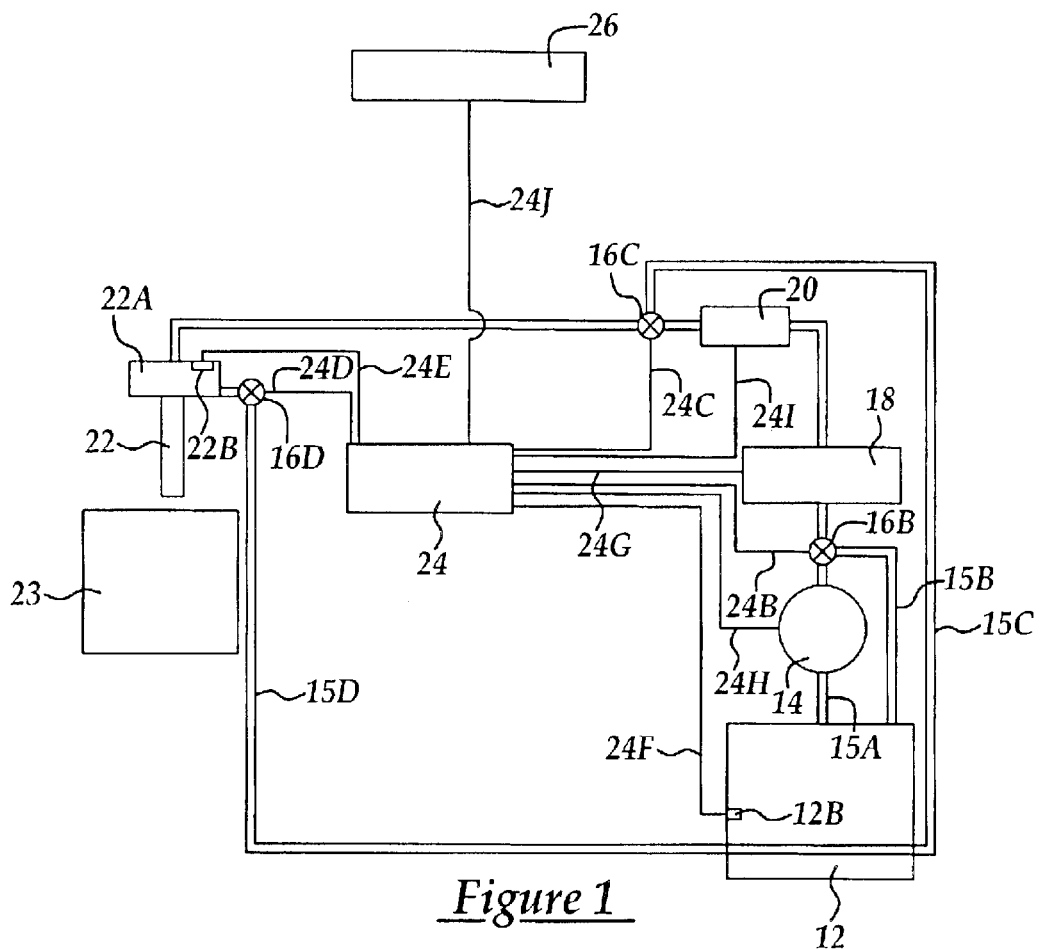
FIG. 1 shows a schematic diagram of the recirculating process solution delivery system according to an embodiment of the invention.

Referring to FIG. 1, is shown an exemplary embodiment of a side view schematic configuration of the recirculating solution delivery system of the present invention. Solution holding tank 12, for example a wet etching solution, is in fluidic communication with a fluid pumping means 14 by way of fluid flow pathway 15A, the fluid pumping means, for example, may be a conventional mechanical fluid pump for providing fluidic flow rates through the fluid flow pathways to provide a recirculation flow rate of, for example, between about 100 to 1000 ml/min. Optionally, downstream of the fluid pumping means 14 is a fluid flow control valve 16B for redirecting a fluid flow between fluid flow pathways 15A and 15B to selectively return a fluid flow to solution holding tank 12 or to provide a fluid flow downstream along fluid flow pathway 15A to heat exchanger 18. The heat exchanger 18 may be any conventional fluidic heat exchanger for controlling a fluid temperature, preferably between about 20° C. and about 80° C. Downstream of heat exchanger 18, disposed in fluid flow pathway 15A is a conventional fluid flow meter 20, preferably able to determine a flow rate preferably between about 100 to 1000 ml/min.

Optionally, disposed downstream of fluid flow meter 20 in a second fluid flow control valve 16C for redirecting a fluid flow between fluid flow pathways 15A and 15C to selectively return a fluid flow to solution holding tank 12 or provide a fluid flow downstream to fluid dispenser 22. The fluid dispenser 22 for example, is a conventional fluid dispenser used for dispensing fluid in a single wafer wet spin etching process in single wafer wet spin etcher 23.

For example, it has been found that providing a recirculation path partially extending along a process flow fluid pathway, for example along recirculation flow pathway 15B or recirculation flow pathway 15C is insufficient to maintain a required process solution temperature, for example, in an single wafer wet spin etching process, allowing for a sufficiently rapid startup following a period of process idleness or non-use of the etcher 23. For example, the period of idleness may vary from a few minutes to several hours, the period of idleness frequently unable to be determined before a startup time due to unpredictable delays in upstream processes. For example, in a single wafer wet spin etching process, the temperature of the etching solution may drop form a required etching operating temperature by more than 10° C., for example, about 40° C. over several hours. In operation, a first bypass route may be advantageously used for extended periods of idleness to reduce energy usage, for example bypassing heat exchanger 18, for example by directing the fluid flow along fluid flow pathway 15B, while maintaining a fluid mixing state of the solution by recirculation along the first bypass route. Provision of a second bypass route including for example, fluid flow pathway 15C, where the process solution is recirculated to the solution holding tank 12 after passing through the heat exchanger 18 may advantageously be provided for shorter periods of idleness in the process or when closer to a startup time since a shorter startup time period will be required to bring the etching solution to operating temperature at the fluid delivery point, for example, fluid dispenser 22. Upon startup of the process, an additional period of time is required to flush the entire fluid delivery pathway 15A, for example up to dispenser 22, with process solution to bring the process solution up to operating temperature. For example, the etching solution is redirected from recirculation flow pathways 15C by valve 16C along fluid flow pathway 15A to the fluid dispenser 22 for a period of time until a desired solution delivery temperature is reached. Depending on the size and thermal transfer properties of the fluid delivery pathway providing fluid to the process, for example along line 15A, a period of flushing the etching solution through fluid dispenser 22 may require from about 100 seconds to about 200 seconds to reach a steady state operating temperature, for example about 40° C. in a typical single wafer wet spin etching process for removing polymeric residues following a dry etching process. For example, a typical single wafer wet spin etcher includes a fluid delivery line portion having a length from about 2 to about 10 meters downstream of the heat exchanger requiring flushing or warmup. It will be appreciated that the required warmup time may vary depending on the length and thermal characteristics of the fluid delivery pathway and the fluid dispenser. For example, the fluid delivery lines may be about ½ inch to about ¾ inches in diameter, formed of either stainless steel or polyethylene, and may include insulation which may affect a required startup time. In addition, the size and thermal mass of the fluid flow dispenser affects the required startup time, a larger thermal mass requiring a longer warmup period to bring the solution to the required operating temperature.

Still referring to FIG. 1, in one embodiment of the present invention, a recirculating solution delivery system is provided including at least one fluid flow recirculation pathway extending up to at least to the process station including a fluid dispenser to include at substantial portion the process fluid delivery pathway. Preferably the substantial portion of the fluid delivery pathway included in the recirculation pathway makes thermal contact with a portion of fluid dispenser 22. For example, a solution reservoir e.g., 22A may be provided in thermal exchange relationship with the fluid dispenser 22 for transfer of heat from the recirculating fluid to the fluid dispenser 22. As another alternative, the fluid flow pathway is formed (e.g., wound) (not shown) in contact with an outer portion of the dispenser to effect heat exchange. A fluid flow switching valve 16D is preferably included in the fluid delivery pathway, for example downstream of solution reservoir 22A to redirect a process fluid flow pathway along a third bypass route to process solution holding tank 12 along fluid pathway 15D.

In another embodiment, the recirculating solution delivery system is provided including a plurality of recirculation pathways. For example a second recirculation pathway, for example 15B, is provided to bypass energy consuming devices in the fluid delivery pathway, for example heat exchanger 22, for extended periods of idleness. Additionally, a third recirculation pathway, for example recirculation pathway 15C, including a greater portion of the fluid delivery pathway may be provided to reduce a startup time period, for example including passing through energy consuming devices included in the fluid delivery pathway, for example heat exchanger 22.

Still referring to FIG. 1, in another embodiment, the fluid flow switching valves for example, 16B, 16C, and 16D are preferably automated and in communication with a controlling means, for example a pre-programed controller 24, for receiving a command or signal to perform a fluid redirecting operation. For example, upon receiving a redirecting (switching) signal or command, the respective valves 16B, 16C, and 16D selectively redirect a process fluid flow either along a fluid delivery pathway, e.g., 15A or along a selected recirculation fluid flow pathways e.g., 15B, 15C, and 15D to cover a predetermined portion of the process fluid delivery pathway 15A recirculating the process solution to process solution holding tank 12. The pre-programmed controller 24 preferably includes manual override operation and is in at least signal sending, and optionally, receiving communication with fluid flow switching valves, for example, 16B, 16C, and 16D. For example, communication lines 24B, 24C and 24D respectively, are shown providing signal communication means with controller 24, but may include wireless communication means, for example by including wireless communication circuits associated with the respective flow control valves. In addition, at least receiving communication means, for example communication lines 24E and 24F are provided to temperature sensors, for example 12B and 22B, respectively, disposed to monitor the process solution temperature at selected points along fluid delivery pathway, for example, at the solution holding tank 12 and at the process solution delivery point, e.g., solution reservoir 22A. In addition, the heat exchanger 18, pumping means 14, and flow controller 20, are each in responsive communication (e.g., sending and/or receiving) communication with controller 24 for controlling a pumping speed heat exchanger power, and flow rate e.g., via communication lines 24G, 24H and 24I.

In another embodiment, the controller 24 is in at least signal receiving communication with an upstream process controller 26 e.g., by communication line 24J and/or in signal communication with a server in networked signal communication with both the upstream process controller and the controller 24. For example, the upstream process may include a manufacturing process immediately preceding the single wafer wet spin etching process, for example a dry etching process. For example, the communication may be by hard wired or wireless signal communication means, for example the controller included in a distributed communications network for communicating with a plurality of semiconductor wafer process stations.

In one embodiment of the method of the present invention, in exemplary operation, the temperature dependent solution delivery process, for example, a single wafer wet spin etching process, a substantial portion of the fluid delivery pathway is continuously provided with etching solution to follow a recirculation flow pathway including a substantial portion of the fluid delivery pathway, for example, preferably making thermal contact with the fluid dispenser. For example, at least one bypass flow pathway is included in the recirculation flow pathway for passing the etching solution along a substantial portion of the fluid delivery pathway and returning the etching solution to a fluid holding source. Preferably, the substantial portion of the fluid delivery pathway includes making thermal contact with the fluid dispenser to maintain a fluid flow delivery pathway steady state operating temperature and thereby reduce a required startup time to reach a fluid delivery temperature following a period of non-operation of the temperature dependent solution delivery process.

In another embodiment, a non-operation time period is periodically determined (projected) followed by determination of a desired fluid recirculation flow pathway. For example, if the projected non-operating time (time to startup) is greater than a predetermined time period a recirculation pathway including a lesser portion of the fluid delivery pathway may be selected, for example bypassing energy consuming devices in the fluid delivery pathway and cutting or reducing power to energy consuming devices, for example, a heat exchanger. Further, as the projected time to startup decreases and passes predetermined time to startup triggers, greater portions of the fluid delivery pathway may be employed for recirculation. For example, upon approaching within a predetermined or projected time to startup, a signal is communicated to the heat exchanger to turn on or increase power and the fluid recirculation pathway is altered to include a larger portion of the fluid delivery pathway, for example including passing through the heat exchanger. For example, according to exemplary implementation, valves 16B and 16C are selectively switched to redirect etching solution flow along recirculation pathway including 15B to recirculation pathway including 15C. Likewise, upon closer approach to a predetermined or projected start up time, a substantial portion of the fluid delivery pathway is selected to be included in the recirculation pathway, for example selectively switching valves 16C and 16D to provide a recirculation flow pathway along 15C.

In another embodiment, the controller 24 is additionally in at least receiving communication with an upstream process 26, for example a dry etching process prior to a single wafer wet spin etching process. The controller receives information from the upstream process via either the upstream process or from a server in communication with the upstream process indicating a projected starting time period for the single wafer wet spin etching process. The communication may be by either hard wired or wireless communication from the upstream process or from a server in networked communication with both the upstream process and the wet etching process. Based on the predetermined time period, the fluid delivery system is configured to have a predetermined recirculation flow pathway which may be reconfigured to include a lesser or larger portion of the fluid delivery pathway according to projected predetermined starting time periods for the etching process which may be periodically updated.

Figure 2:
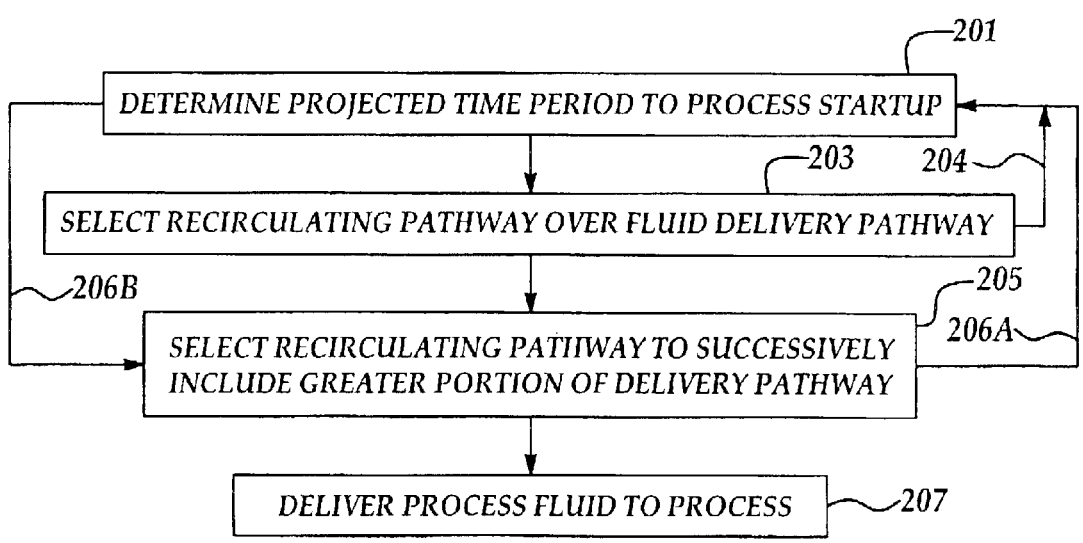
FIG. 2 is a process flow diagram including several embodiments of the method of the present invention.

Referring to FIG. 2 is a process flow diagram including several embodiments of the method of the present invention. In process 201 a time to startup of the single wafer wet spin etching process is projected. In process 203 a recirculation pathway is selected based on the time to startup. As indicated in by direction process arrow 204, the projected time to startup in process 201 is updated on a periodic basis to select the recirculation pathway. In process 205, a recirculation pathway is successively selected to include passing the etching solution along increasing contiguous lengths of the fluid delivery pathway in a direction of the etching process including passing through a heat exchanger according to selected projected time periods to startup, eventually including a substantial portion of the fluid delivery pathway. As indicated by directional process arrows 206A and 206B the projected time to startup is periodically checked to determine the recirculation pathway. In process 207, the etching solution is delivered to the etching process at a process temperature thereby reducing a warmup time.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A recirculating process fluid delivery system for improving process fluid temperature control at a process fluid delivery point comprising:
    a fluid dispenser comprising a process delivery point in communication with a fluid delivery pathway for delivering a process fluid to a process;
    a process fluid heat exchanger disposed in the fluid delivery pathway for controlling the process fluid temperature;
    a process fluid pumping means for delivering the process fluid along the fluid delivery pathway;
    a plurality of recirculation pathways in selectable fluidic communication with the fluid delivery pathway for recirculating the process fluid along one of the plurality of recirculation pathways;
    wherein each of the plurality of recirculation pathways are selectable to pass the process fluid along successively increasing contiguous length portions of the fluid delivery pathway in the direction of the process to achieve a desired process fluid delivery temperature at a projected process starting time.

2. The recirculating process fluid delivery system of claim 1, wherein at least one of the recirculation pathways makes heat exchange contact with the fluid dispenser.

3. The recirculating process fluid delivery system of claim 1, wherein at least one of the plurality of recirculating pathways is arranged to bypass the process fluid heat exchanger.

4. The recirculating process fluid delivery system of claim 1, wherein at least one of the recirculating pathways passes through the process fluid heat exchanger.

5. The recirculating process fluid delivery system of claim 1, wherein the plurality of recirculation pathways comprises a first recirculating portion receiving process fluid passing through the process fluid heat exchanger and a second recirculating portion receiving process fluid bypassing the process fluid heat exchanger.

6. The recirculating process fluid delivery system of claim 1, further comprising means for selecting a recirculation pathway in response to the projected process starting time.

7. The recirculating process fluid delivery system of claim 1, further comprising a means for determining the projected process starting time in response to a signal received from an upstream process.

8. The recirculating process fluid delivery system of claim 1, wherein the process comprises a single wafer wet spin etcher for etching a semiconductor wafer process surface.

9. The recirculating process fluid delivery system of claim 1, wherein the fluid delivery pathway comprises a fluid delivery line having a length of about 2 to about 20 meters for delivery of the process fluid at a temperature of from about 20° C. to about 80° C.

10. The recirculating process fluid delivery system of claim 1, comprises three recirculating pathways wherein:
    a first recirculating pathway communicates with the fluid delivery pathway upstream of the heat exchanger;
    a second recirculating pathway communicates with the fluid delivery pathway downstream of the heat exchanger; and,
    a third recirculating pathway communicates with the fluid delivery pathway at about the point of process fluid delivery.

11. The recirculating process fluid delivery system of claim 10, further comprising means for delivering the process fluid along at least one fluid recirculation pathway for a selected time period at a predetermined process temperature.

12. The recirculating process fluid delivery system of claim 11, further comprising means for signal communication with an upstream process for determining the projected process starting time.

13. The recirculating process fluid delivery system of claim 12, further comprising a means for determining the projected process starting time in response to a signal received from an upstream process.

14. A single wafer wet spin etcher for etching a semiconductor wafer process surface including a recirculating etching fluid delivery system comprising:
    a fluid dispenser in communication with an etching fluid delivery pathway for delivering an etching fluid to the spin etcher;
    a heat exchanger disposed in the etching fluid delivery pathway for controlling the etching fluid temperature;
    a plurality of recirculation pathways in selectable fluidic communication with the etching fluid delivery pathway for recirculating the etching fluid along one of the recirculating pathways;
    wherein each of the plurality of recirculation pathways are selectable to pass the etching fluid along successively increasing contiguous length portions of the etching fluid delivery pathway in the direction of the spin etcher to achieve a desired etching fluid temperature at a projected process starting time.

* * * * *